United States Patent
Lin et al.

(10) Patent No.: US 7,663,177 B2
(45) Date of Patent: Feb. 16, 2010

(54) NON-VOLATILE MEMORY DEVICE AND FABRICATING METHOD THEREOF

(75) Inventors: Cha-Hsin Lin, Hsinchu (TW); Lurng-Shehng Lee, Hsinchu (TW); Pei-Jer Tzeng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/247,133

(22) Filed: Oct. 12, 2005

(65) Prior Publication Data

US 2007/0029602 A1 Feb. 8, 2007

(30) Foreign Application Priority Data

Aug. 3, 2005 (TW) ............................... 94126396 A

(51) Int. Cl.
*H01L 29/788* (2006.01)
(52) U.S. Cl. ............... 257/315; 257/321; 257/E29.129; 257/E29.309
(58) Field of Classification Search ................ 438/197, 438/257, 261, 264, 287; 257/314–316, 321, 257/324, E29.309, 325
See application file for complete search history.

(56) References Cited

U.S. PATENT DOCUMENTS

| 6,642,573 | B1 | 11/2003 | Halliyal et al. |
| 6,809,371 | B2 * | 10/2004 | Sugiyama .................... 257/314 |
| 6,897,533 | B1 * | 5/2005 | Yang et al. .................. 257/369 |
| 2004/0004859 | A1 * | 1/2004 | Forbes et al. ........... 365/185.05 |
| 2004/0145024 | A1 | 7/2004 | Chen et al. |
| 2005/0199944 | A1 * | 9/2005 | Chen et al. .................. 257/324 |
| 2006/0001083 | A1 * | 1/2006 | Bhattacharyya .............. 257/317 |
| 2006/0273377 | A1 * | 12/2006 | Chae et al. .................. 257/321 |
| 2006/0284244 | A1 * | 12/2006 | Forbes et al. ................ 257/324 |
| 2007/0045706 | A1 * | 3/2007 | Bhattacharyya et al. ..... 257/314 |

OTHER PUBLICATIONS

Lin et al., *High-Performance Nonvolatile $HfO_2$ Nanocrystal Memory*, 2005 IEEE Electron Device Letters, pp. 1-3.
Tan et al., Over-Erase Phenomenon in SONO-Type Flash Memory and its Minimization Using a Hafnium Oxide Charge Storage Layer, Jul. 2004, IEEE Transactions on electron Devices, vol. 51, No. 7, pp. 1143-1147.
Lee et al., *Twin-Bit Silicon-Oxide-Nitride-Oxide-Silicon (Sonos) Memory by Inverted Sidewall Patterning (TSM-ISP)*, Dec. 2003, IEEE Transactions on Nanotechnology, vol. 2. No. 4, pp. 246-252.

* cited by examiner

*Primary Examiner*—Tuan N. Quach
(74) *Attorney, Agent, or Firm*—Rabin & Berdo, P.C.

(57) ABSTRACT

A non-volatile memory device and fabricating method thereof are provided. In the deposition to form a tunneling dielectric layer, a composite charge trapping layer and a block dielectric layer, an ingredient of a depositing material or the depositing material is adjusted to form a grading energy level structure, such that carriers are trapped or erased more easily in accordance with a variation in grading energy level. Therefore, the carriers are stored more effectively and the probability that the electric leakage occurs is reduced substantially.

10 Claims, 7 Drawing Sheets

NON-VOLATILE MEMORY DEVICE AND FABRICATING METHOD THEREOF

BACKGROUND

1. Field of the Invention

The present invention relates to a semiconductor memory device and fabricating method thereof, and more particularly to a non-volatile memory device and fabricating method thereof.

2. Description of the Related Art

Generally, semiconductor memory device may be classified into volatile memory device and non-volatile memory device. When power supply is interrupted, the data stored in the volatile memory device will disappear, while the data stored in the non-volatile memory device will still be stored. That is to say, the volatile memory device has the property that is the memory will disappear as the power is off. Therefore as the power supplied is discontinuous or interrupted frequently, or the element is an electronic element that requires low voltage only, such as memory card of the digital camera, portable disk, mobile phone, the non-volatile memory device is commonly used to store the data. As a result, the non-volatile memory device plays a very important role in the convenience-oriented modern society.

For the non-volatile memory device, the storage of data is achieved by two ways: one is by a floating gate device and the other is by a charge trapping device.

As shown in FIG. 1, a non-volatile memory device using the floating gate device is illustrated, which has a floating gate device 110 under a gate 120. Its memory is conducted by storing the electrons on a floating gate 112 that is a good conductive material, so that the electrons trapped on the floating gate 112 are distributed uniformly thereon, such that the thresh voltage generates a shift upon which determines whether memorize or not. However, the floating gate device can only store one bit, causing the production cost raised, so it cannot meet the economic efficiency.

With reference to FIG. 2, a non-volatile memory device using the charge trapping device is illustrated, which has a charge trapping device 210 stacked to two or three layers under a gate 220, and in which there is a charge trapping layer 212 with high deep-level trap density. The high deep-level trap density is an insulating material that can catch electrons, for example, $Si_3N_4$ or $Al_2O_3$, so the electrons can be caught effectively to store charges. However, since the bottom of the charge trapping device 210 is an oxide layer 214, in which the positive charges are trapped during erasing, causing the barrier of the oxide layer 214 reduced, the electrons trapped in the charge trapping layer 212 can easily tunnel through the oxide layer 214, causing the loss of electrons, and therefore the storage time is reduced. And conventionally, the charge trapping layer used to store charges is a single-layer structure, so its modulation for storing charge is not high. In recent years, the thickness of the oxide layer is reduced in order to increase the quantity of the stored charges, and further to increase the electric leakage.

Accordingly, for the non-volatile memory device by means of the charge trapping device, there is still a space for improvement.

SUMMARY

In view of the above problems, the object of the invention is to provide a non-volatile memory device and fabricating method thereof to solve the problems disclosed in the prior art.

Therefore, to achieve the above object, the fabricating method of the non-volatile memory device disclosed in the present invention includes providing a substrate; forming a tunneling dielectric layer on the substrate; forming a composite charge trapping layer on the tunneling dielectric layer in an energy band structure which decreases first and then increases, thereby generating a composition grading energy band; forming a barrier dielectric layer on the composite charge trapping layer; and forming a conductor layer on the block dielectric layer.

Herein, the substrate may be a silicon substrate, or the material may be poly Si, Ni, Pt, TiN, Al, tantalum nitride, silicide or compounds thereof, etc. The material of the tunneling dielectric layer and the block dielectric layer is an oxide, for example, $SiO_2$ or $Al_2O_3$ and etc.; or a high dielectric constant material with high energy gap, so as to simplify the process complexity.

Therein, the composite charge trapping layer contains many materials, which may be $SiO_2$, $Si_3N_4$, $Al_2O_3$, $HfO_2$, $TiO_2$, $Ta_2O_5$, $BaSrTiO_3$, $PbLaZrTiO_3$, $Y_2O_3$, $La_2O_3$, a-Si, a-SiC, a-SiGe, a-Ge or combination thereof in any proportion. In fact, the composite charge trapping layer may be form by deposition process. For example, in the deposition of a tunneling dielectric layer, composite charge trapping layer and block dielectric layer with a chemical vapor deposition technique, an ingredient of a depositing material or the depositing material is adjusted to form a grading energy level structure, such that carriers are trapped or erased more easily in accordance with a variation in grading energy level. Therefore, the electrons are stored more effectively and the probability that the electric leakage occurs is reduced substantially. Otherwise, after the composite charge trapping layer is formed, an annealing process may be carried on, and many crystalline particles will be formed in the composite charge trapping layer after a suitable heat treatment, and thereby the charge storage capability of the device is further enhanced.

Finally, a source/drain region is formed in the substrate at two sides of the conductor layer, and a non-volatile memory device is thus obtained.

To achieve the above object, another non-volatile memory device is disclosed, which includes a substrate, a tunneling dielectric layer, a composite charge trapping layer, a block dielectric layer and a conductor layer, wherein the tunneling dielectric layer, the composite charge trapping layer, the block dielectric layer and the conductor layer are formed on the substrate sequentially. And, the composite charge trapping layer has a composition grading energy band structure. That is to say, the energy band structure of this composite charge trapping layer decreases first and then increases to form a quantum-well-like structure, such that the charges are stored more effectively to avoid the loss of charges. And the quantity of charges may also be adjusted freely by using energy level fluctuant structure and variation, thereby adjusting the shift value of the device threshold voltage.

Herein, the substrate may be a silicon substrate, or the material may be poly Si, Ni, Pt, TiN, Al, tantalum nitride, silicide or compounds thereof, etc. The material of the tunneling dielectric layer and the block dielectric layer is an oxide, for example $SiO_2$ or $Al_2O_3$ and etc.; or a high dielectric constant material with high energy gap, thereby simplifying the process complexity.

Therein, the composite charge trapping layer contains many materials, which may be $SiO_2$, $Si_3N_4$, $Al_2O_3$, $HfO_2$, $TiO_2$, $Ta_2O_5$, $BaSrTiO_3$, $PbLaZrTiO_3$, $Y_2O_3$, $La_2O_3$, a-Si, a-SiC, a-SiGe, a-Ge or combination thereof in any proportion.

Also, a plurality of crystalline particles is included in the composite charge trapping layer, and therefore the charge storage capability of the device is further enhanced. And the material of the composite charge trapping layer except the crystalline particle region is an amorphous material.

Otherwise, it further includes a source/drain region in the substrate at two sides of the conductor layer.

The characteristics and operation of the present invention are described in detail with the drawings as best embodiments.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION

First, the object of the present invention is to replace the charge trapping device by a high dielectric constant or amorphous material having a grading energy level structure to form a charge trapping device with quantum-well-like structure. The variation in grading energy level of the material in the charge trapping device can be used to store charges more effectively, so as to avoid a loss of charge. And the quantity of the charge may also be adjusted freely by using energy level fluctuant structure and variation, thereby adjusting the shift value of the device threshold voltage.

Hereinafter, embodiments are illustrated to describe the content of the present invention in detail, in accompanying with the drawings. The symbols referred in the description are symbols of the reference drawings.

With reference to FIG. 3A to 3F, they are sectional views of the fabricating flow of the non-volatile memory device according to one embodiment of the present invention.

Figure 1:
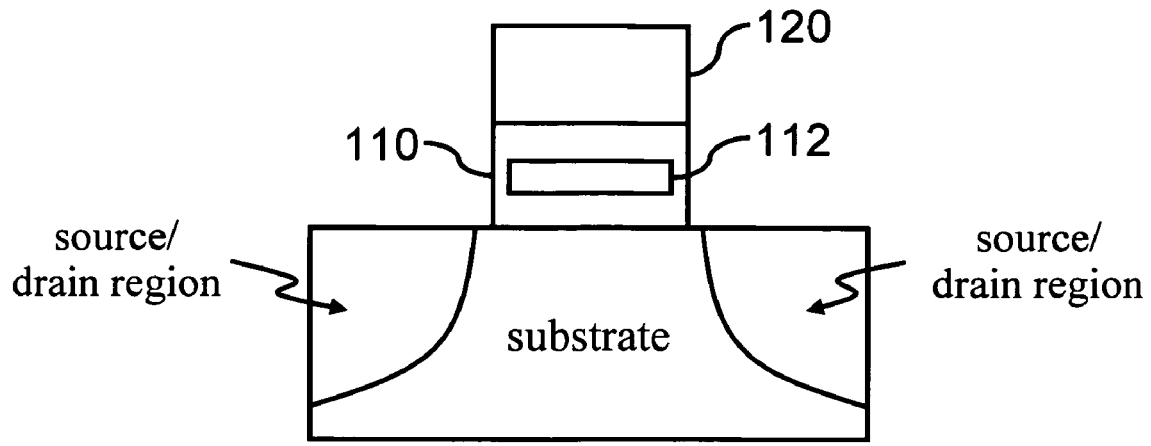
FIG. 1 is a sectional view of a conventional non-volatile memory device.
Figure 2:
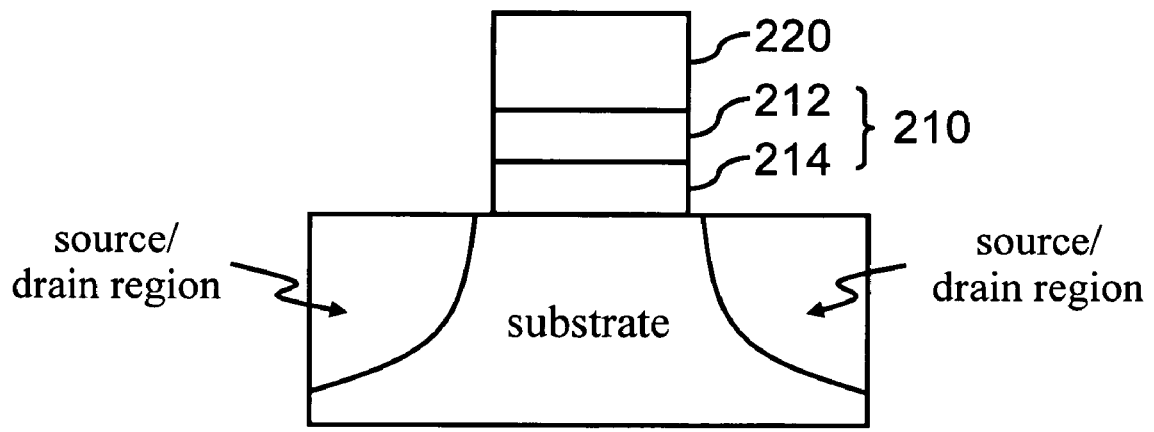
FIG. 2 is a sectional view of another conventional non-volatile memory device.
Figure 3A:
FIG. 3A to 3F are sectional views of the fabricating flow of a non-volatile memory device according to an embodiment of the present invention.

As shown in FIG. 3A, a substrate 310 is provided first, for example, a silicon substrate. Furthermore, the material of the substrate may be poly Si, Ni, Pt, TiN, Al, tantalum nitride, silicide and their compounds, mixture, etc.

Figure 3B:
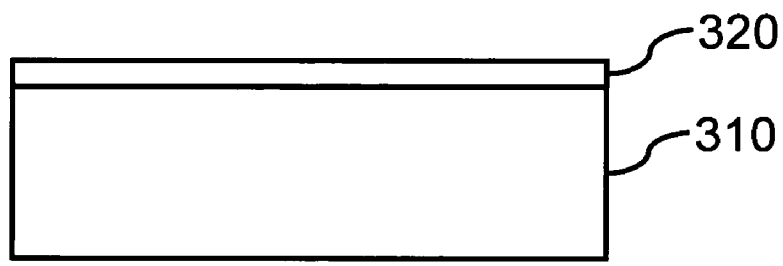

Then, a tunneling dielectric layer 320 is formed on the substrate 310, as shown in FIG. 3B. The material of the tunneling dielectric layer is an oxide, for example, $SiO_2$ or $Al_2O_3$ and etc.

Figure 3C:
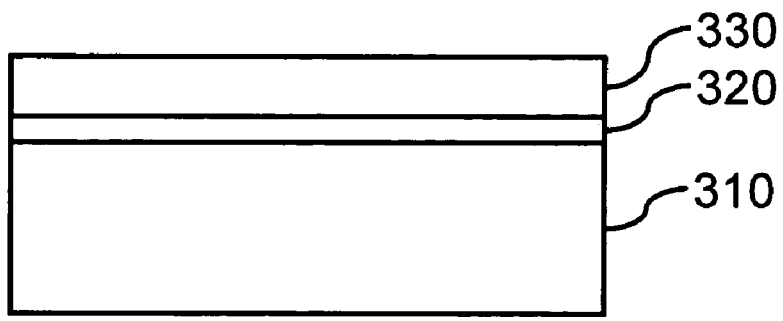

And then, a composite charge trapping layer 330 is formed on the tunneling dielectric layer 320 in an energy band structure which decreases first and then increases, thereby generating a composition grading energy band, as shown in FIG. 3C. Therefore, the composite charge trapping layer 330 contains many materials, which may be $SiO_2$, $Si_3N_4$, $Al_2O_3$, $HfO_2$, $TiO_2$, $Ta_2O_5$, $BaSrTiO_3$, $PbLaZrTiO_3$, $Y_2O_3$, $La_2O_3$, a-Si, a-SiC, a-SiGe, a-Ge or combination thereof in any proportion.

Figure 3D:
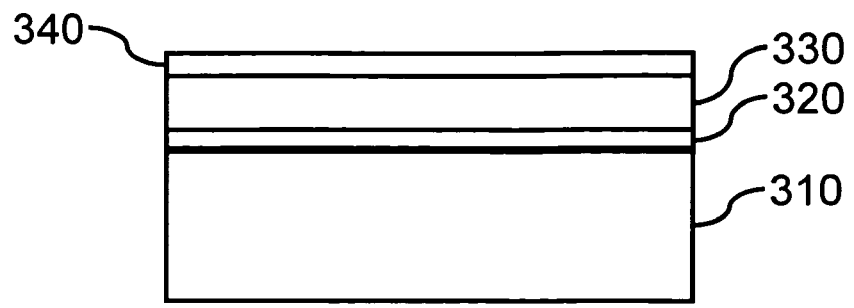

Then, a block dielectric layer 340 is formed on the composite charge trapping layer 330, as shown in FIG. 3D. The material of the block dielectric layer is also an oxide, for example, $SiO_2$ or $Al_2O_3$ and etc.

Figure 3E:
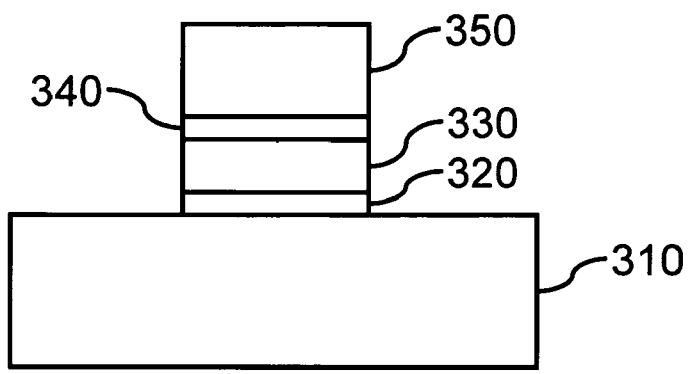
Figure 3F:
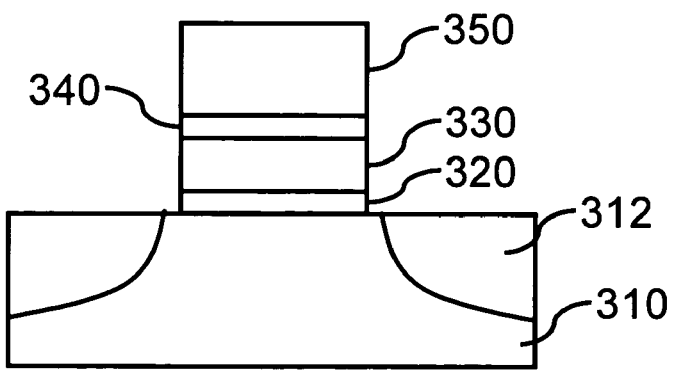

And then, a conductor layer 350 is formed on the block dielectric layer 340 to be used as a gate of the non-volatile memory device, as shown in FIG. 3E. Finally, a source/drain region 312 is formed in the substrate 310 at two sides of the gate (i.e. the conductor layer 350), and a non-volatile memory is thus obtained, as shown in FIG. 3F.

Figure 4A:
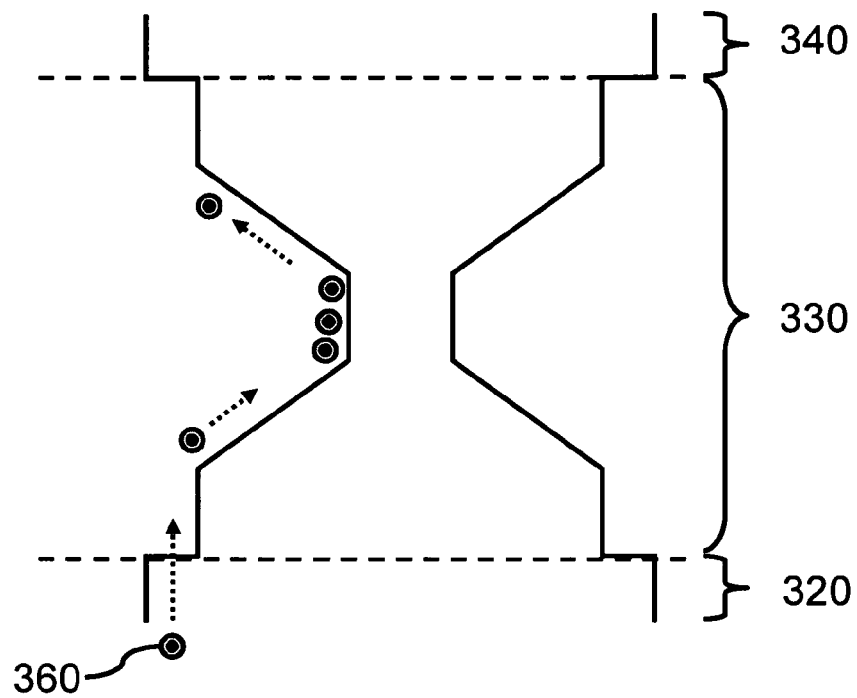
FIG. 4A is a schematic view of an embodiment of a quantum-well-like structure according to the present invention.

Therefore, due to the variation in grading energy level of the contained material, the tunneling dielectric layer 320, the composite charge trapping layer 330 and the block dielectric layer 340 form a quantum-well-like structure as shown in FIG. 4A. With this composition grading energy band, the carriers 360 can be trapped or erased more easily in accordance with a variation in grading energy level after tunneling through the tunneling dielectric layer 320.

In other words, the composite charge trapping layer can be formed with the high dielectric constant materials or amorphous materials with a quantum-well-like energy level structure, such that the carriers are trapped in the nonconductive layer, and also feel a suitable energy barrier, and therefore the charges can be stored more effectively, and also the probability that the electric leakage occurs may be reduced substantially.

Figure 4B:
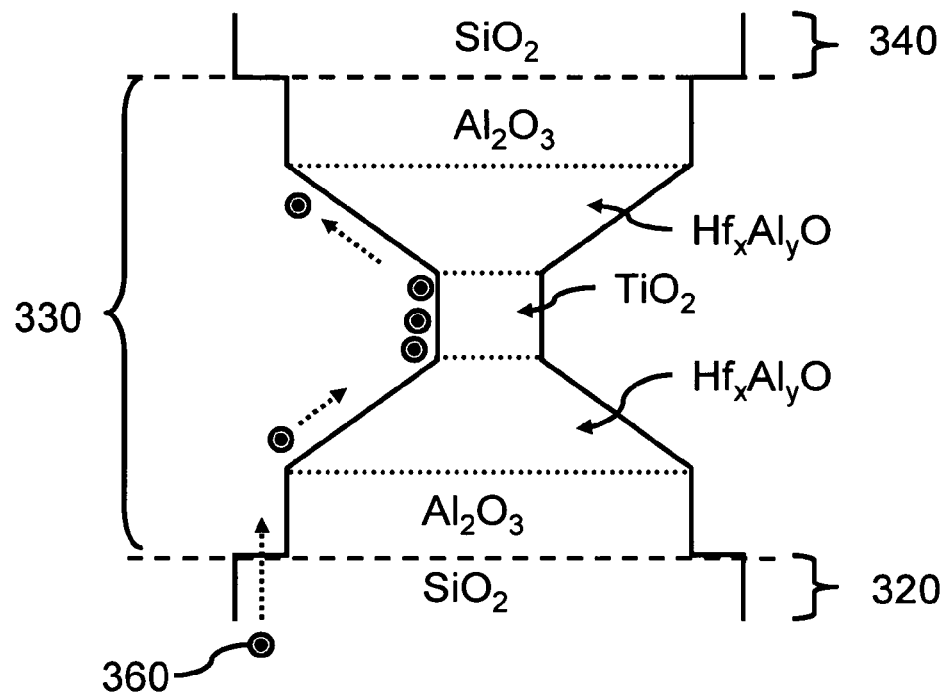
FIG. 4B is a schematic view of another embodiment of the quantum-well-like structure according to the present invention.

For example, for the high dielectric constant material, in deposition of the tunneling dielectric layer 320, the composite charge trapping layer 330 and the block dielectric layer 340 with a chemical vapor deposition technique, the composition grading energy band of the quantum-well-like structure as shown in FIG. 4B may be obtained by changing the depositing materials sequentially. For example, the depositing materials may be changed gradually in the sequence of $SiO_2$/$Al_2O_3$/$Hf_xAl_yO$/$TiO_2$/$Hf_xAl_yO$/$Al_2O_3$/$SiO_2$ in which x, y are the doping quantity of Hf and Al, respectively, and x, y are positive numbers which are less than 1. Herein, the energy band of $SiO_2$ is the highest among the four materials, and the energy bands of $Al_2O_3$ and $Hf_xAl_yO_2$ are lowered sequentially, and the energy band of $TiO_2$ is the lowest among the four materials. Therefore a composition grading energy band with a quantum-well-like energy level structure is formed.

Figure 4C:
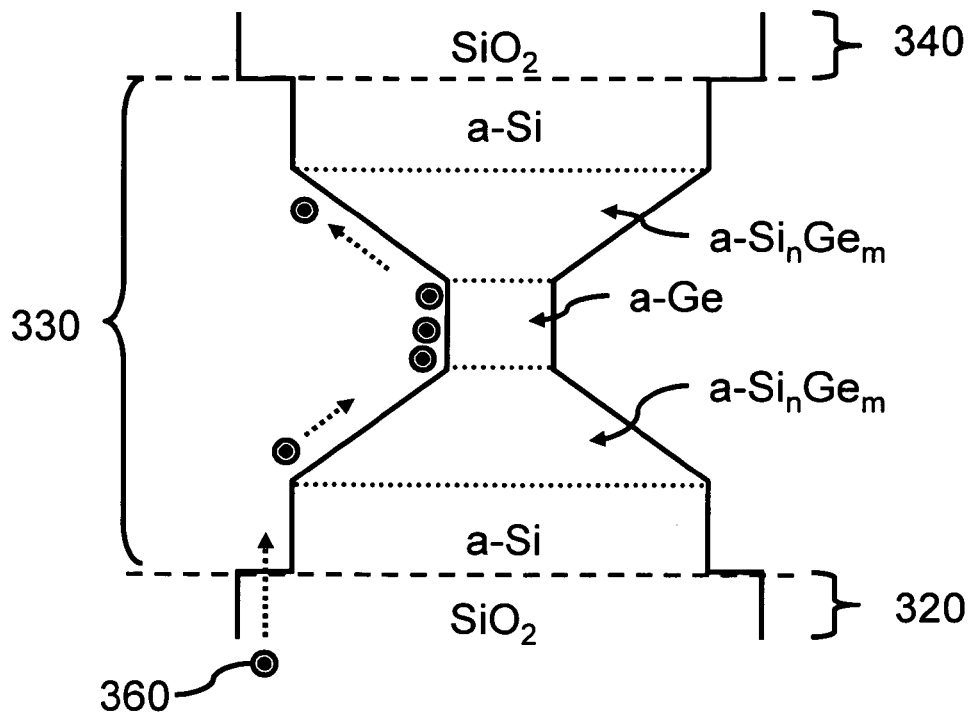
FIG. 4C is a schematic view of still another embodiment of a quantum-well-like structure according to the present invention.

Additionally, for the amorphous material, in the deposition of the tunneling dielectric layer 320, the composite charge trapping layer 330 and the block dielectric layer 340 with a chemical vapor deposition technique, a composition grading energy band with the quantum-well-like structure as shown in FIG. 4C may be obtained by changing the doping proportion of some ingredients in the depositing materials varied sequentially. For example, when depositing the composite charge trapping layer 330, the doses of a-Si and a-Ge in the materials can be changed gradually in accordance with the doping proportion of a-Si/a-$Si_n$$Ge_m$/a-Ge/a-$Si_n$$Ge_m$/a-Si, wherein n, m are the doping quantity of a-Si and a-Ge, respectively, and they are positive numbers less than 1. Herein, the energy band of $SiO_2$ is the highest among the four materials, and the energy bands of a-Si and a-$Si_nGe_m$ are lowered sequentially, and the energy band of the a-Ge is the lowest among the four materials, therefore a composition grading energy band with a quantum-well-like energy level structure is formed.

Herein, although only four materials are taken as an example to illustrate, in practice the above quantum-well-like structure can be designed by selecting suitable categories and quantity of the category depending on the energy level of the materials, in accordance with the requirement of the charge storage quantity or electric leakage specification. That is to say, in deposition, the ingredient and the material are adjusted in a manner that the energy band decreases first and then increases to form a grading energy level structure, such that carriers are trapped or erased more easily in accordance with a variation in grading energy level.

Figure 5A:
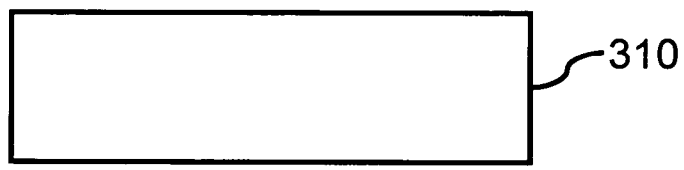
FIG. 5A to 5G are sectional views of the fabricating flow of the non-volatile memory device according to another embodiment of the present invention.
Figure 5B:
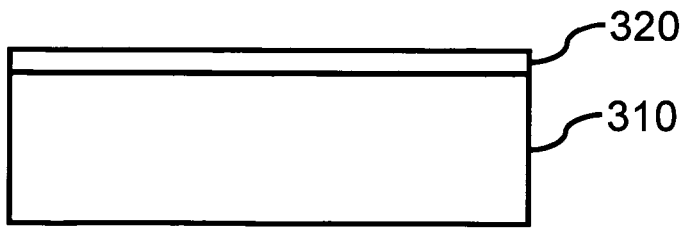
Figure 5C:
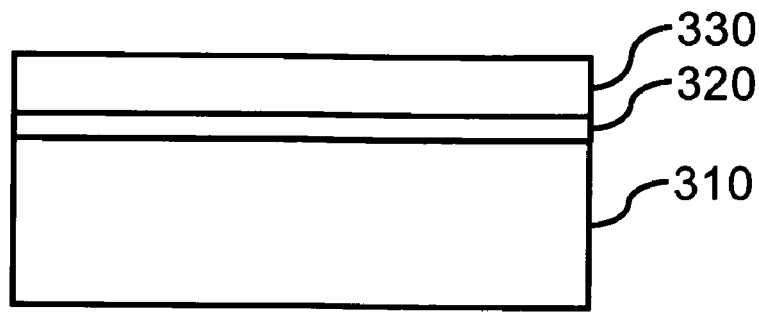
Figure 5D:
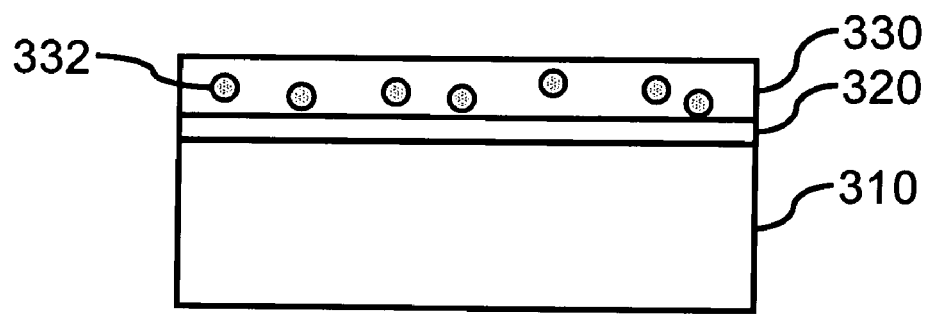
Figure 5E:
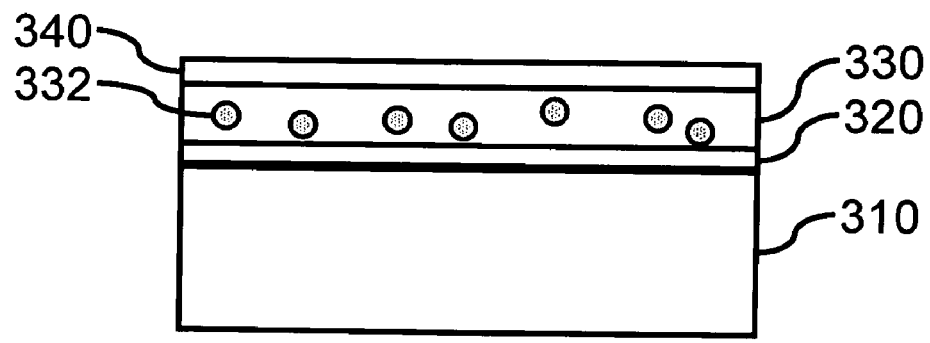
Figure 5F:
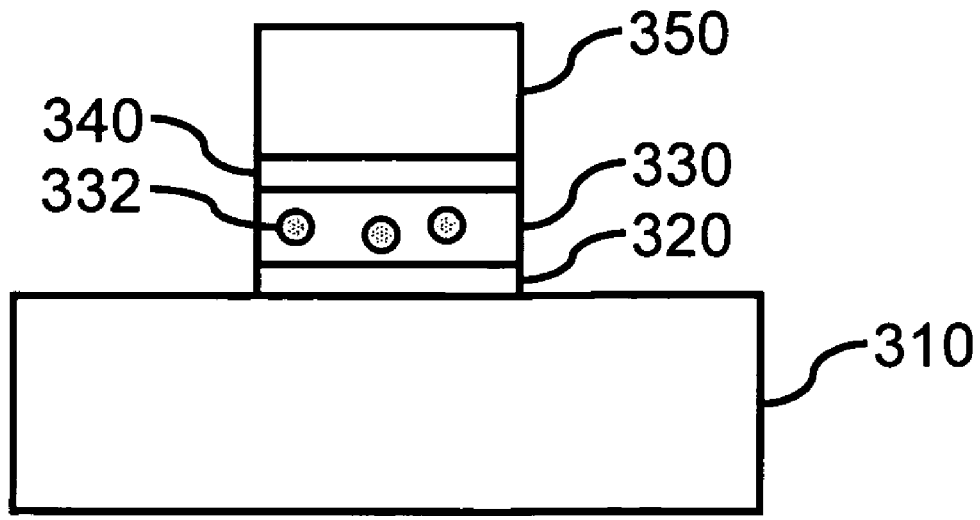
Figure 5G:
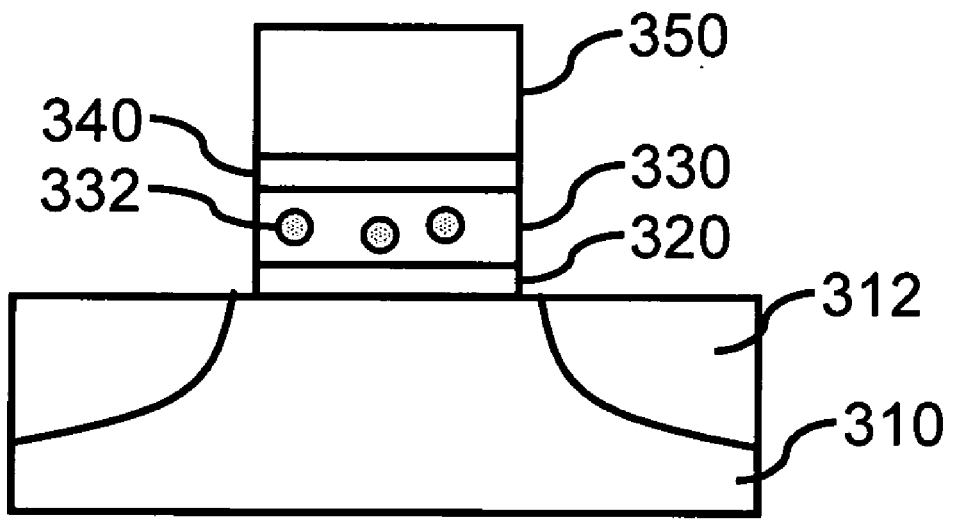

Also, the high dielectric constant material is crystallized partially through a suitable heat treatment, and therefore the charge storage capability is further enhanced. That is to say, as shown in FIG. 5A to 5F, they are sectional views of the fabricating flow of the non-volatile memory device according to another embodiment of the present invention. An annealing process will be carried on after the composite charge trapping layer 330 is formed. The composite charge trapping layer 330 may produce many crystalline particles 332 therein after a suitable heat treatment so as to store charges, as shown in FIG. 5D. This annealing process may also be implemented in other stages of the device fabricating process. And then, a block dielectric layer 340 is formed on the composite charge trapping layer 330, as shown in FIG. 5E. Then, a conductor layer 350 is formed on the block dielectric layer 340, to be used as a gate of the non-volatile memory device, as shown in FIG. 5F. Finally, a source/drain region 312 is formed in the substrate 310 at two sides of the gate (i.e. conductor layer 350), and in that way, a non-volatile memory device can be obtained, as shown in FIG. 5G.

Otherwise, the tunneling dielectric layer 320 and the block dielectric layer 340 may be replaced by a high dielectric constant material with high band gap, so as to simplify the process complexity.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A non-volatile memory device, comprising:
   a substrate;
   a tunneling dielectric layer provided on the substrate;
   a composite charge trapping layer provided on the tunneling dielectric layer and having an energy band structure to construct a composition gradient energy band structure with a quantum-well-like energy level structure, wherein the composite charge trapping layer includes a plurality of different materials, the different materials including a first material that includes at least one element and a second material that includes at least one element which is not present in the first material, the first and second materials being disposed in different layers;
   a block dielectric layer provided on the composite charge trapping layer; and
   a conductor layer provided on the block dielectric layer;
   wherein energy band gaps of the tunneling dielectric layer and the block dielectric layer are higher than energy band gap of the charge trapping layer;
   wherein the materials of the tunneling dielectric layer, the composite charge trapping layer and the block dielectric layer are changed gradually in the sequence of $SiO_2$/$Al_2O_3$/$Hf_xAl_yO$/$TiO_2$/$Hf_xAl_yO$/$Al_2O_3$/$SiO_2$;
   wherein x and y are doping quantities of Hf and Al, respectively, and x and y are not zero; and
   wherein an energy band gap of $SiO_2$ is the highest among the four materials $SiO_2$, $Al_2O_3$, $Hf_xAl_yO$, and $TiO_2$, and energy band gaps of $Al_2O_3$ and $Hf_xAl_yO_2$ are lowered sequentially, and an energy band gap of $TiO_2$ is the lowest among the four materials, so that the composition gradient energy band structure has a quantum-well-like energy level structure.

2. The non-volatile memory device according to claim 1, wherein the composite charge trapping layer further comprises a plurality of crystalline particles.

3. The non-volatile memory device according to claim 2, wherein the composite charge trapping layer is comprised of amorphous material except for a region containing the plurality of crystalline particles.

4. The non-volatile memory device according to claim 1, further comprising a source/drain region provided in the substrate at two sides of the conductor layer.

5. A non-volatile memory device, comprising:
   a substrate;
   a tunneling dielectric layer provided on the substrate;
   a composite charge trapping layer provided on the tunneling dielectric layer and having a composition gradient energy band structure;
   a block dielectric layer provided on the composite charge trapping layer; and
   a conductor layer provided on the block dielectric layer,
   wherein the materials of the tunneling dielectric layer, the composite charge trapping layer and the block dielectric layer are changed gradually in the sequence of $SiO_2$/$Al_2O_3$/$Hf_xAl_yO$/$TiO_2$/$Hf_xAl_yO$/$Al_2O_3$/$SiO_2$, in which x and y are doping quantities of Hf and Al, respectively, and x and y are not zero, and
   wherein an energy band gap of $SiO_2$ is the highest among the four materials $SiO_2$, $Al_2O_3$, $Hf_xAl_yO$, and $TiO_2$, and energy band gaps of $Al_2O_3$ and $Hf_xAl_yO_2$ are lowered sequentially, and energy band gap of $TiO_2$ is the lowest among the four materials, so that the composition gradient energy band structure has a quantum-well-like energy level structure.

6. A non-volatile memory device, comprising:
   a substrate;
   a tunneling dielectric layer provided on the substrate;
   a composite charge trapping layer provided on the tunneling dielectric layer and having a composition gradient energy band structure;
   a block dielectric layer provided on the composite charge trapping layer; and
   a conductor layer provided on the block dielectric layer,
   wherein the materials of the tunneling dielectric layer, the composite charge trapping layer, and the block dielectric layer are changed gradually in the sequence of $SiO_2$/Si/$Si_nGe_m$/Ge/$Si_nGe_m$/Si/$SiO_2$, wherein n and m are the doping quantity of Si and Ge, respectively, and are not zero, and
   wherein an energy band gap of $SiO_2$ is the highest among the four materials $SiO_2$, Si, $Si_nGe_m$, and Ge, and energy band gaps of Si and $Si_nGe_m$ are lowered sequentially, and energy band gap of the Ge is the lowest among the four materials, so that the composition gradient energy band structure has a quantum-well-like energy level structure.

7. A non-volatile memory device, comprising:
a substrate;
a tunneling dielectric layer provided on the substrate;
a composite charge trapping layer provided on the tunneling dielectric layer and having an energy band structure to construct a composition gradient energy band structure with a quantum-well-like energy level structure, wherein the composite charge trapping layer includes a plurality of different materials, the different materials including a first material that includes at least one element and a second material that includes at least one element which is not present in the first material, the first and second materials being disposed in different layers;
a block dielectric layer provided on the composite charge trapping layer; and
a conductor layer provided on the block dielectric layer,
wherein energy band gaps of the tunneling dielectric layer and the block dielectric layer are higher than energy band gap of the charge trapping layer,
wherein the materials of the tunneling dielectric layer, the composite charge trapping layer, and the block dielectric layer are changed gradually in the sequence of $SiO_2/Si/Si_nGe_m/Ge/Si_nGe_m/Si/SiO_2$, wherein n and m are the doping quantity of Si and Ge, respectively, and wherein n and m are not zero, and
wherein an energy band gap of $SiO_2$ is the highest among the four materials $SiO_2$, Si, $Si_nGe_m$, and Ge, and energy band gaps of Si and $Si_nGe_m$ are lowered sequentially, and energy band gap of the Ge is the lowest among the four materials, so that the composition gradient energy band structure has a quantum-well-like energy level structure.

8. The non-volatile memory device according to claim 7, wherein the composite charge trapping layer further comprises a plurality of crystalline particles.

9. The non-volatile memory device according to claim 8, wherein the composite charge trapping layer is comprised of amorphous material except for a region containing the plurality of crystalline particles.

10. The non-volatile memory device according to claim 7, further comprising a source/drain region provided in the substrate at two sides of the conductor layer.

* * * * *